United States Patent
Hamdalla et al.

(10) Patent No.: US 12,495,714 B1
(45) Date of Patent: Dec. 9, 2025

(54) CHLOROPHYLL-INFUSED POLY(3,4-ETHYLENEDIOXYTHIOPHENE): POLYSTYRENE SULFONATE LAYER-BASED PHOTOVOLTAIC SOLAR CELL

(71) Applicant: UNIVERSITY OF TABUK, Tabuk (SA)

(72) Inventors: Taymour A. Hamdalla, Tabuk (SA); A. A. A. Darwish, Tabuk (SA); Syed Khasim, Tabuk (SA); Saleh A. Al-Ghamdi, Tabuk (SA); Eman F. El-Zaidia, Tabuk (SA); Shahid Alfadhli, Tabuk (SA)

(73) Assignee: UNIVERSITY OF TABUK, Tabuk (SA)

( * ) Notice: Subject to any disclaimer, the term of this patent is extended or adjusted under 35 U.S.C. 154(b) by 0 days.

(21) Appl. No.: 19/001,774

(22) Filed: Dec. 26, 2024

(51) Int. Cl.
*H10K 85/10* (2023.01)
*H10K 30/50* (2023.01)
*H10K 30/82* (2023.01)
*H10K 30/88* (2023.01)
*H10K 102/10* (2023.01)
*H10K 102/20* (2023.01)

(52) U.S. Cl.
CPC ......... *H10K 85/1135* (2023.02); *H10K 30/50* (2023.02); *H10K 30/82* (2023.02); *H10K 30/88* (2023.02); *H10K 2102/103* (2023.02); *H10K 2102/20* (2023.02)

(58) Field of Classification Search
None
See application file for complete search history.

(56) References Cited

U.S. PATENT DOCUMENTS 4,197,142 A * 4/1980 Bolton ............... H10F 10/00
250/214 SG

FOREIGN PATENT DOCUMENTS

| CN | 104576931 8 | 6/2017 |
|---|---|---|
| CN | 117202747 A | 12/2023 |
| IN | 201400954 12 | 2/2015 |
| JP | 2012-186310 A | 9/2012 |
| KR | 10-2257985 B1 | 5/2021 |

OTHER PUBLICATIONS

Koifman et al., RSC Adv., 2021, 11, 15131-15152. (Year: 2021).*

(Continued)

*Primary Examiner* — Eli S Mekhlin
(74) *Attorney, Agent, or Firm* — Oblon, McClelland, Maier & Neustadt, L.L.P.

(57) ABSTRACT

A solar cell includes a first layer including a silica material, a second layer including an indium tin oxide material, and a third layer including a chlorophyll-doped poly(3,4-ethylenedioxythiophene):polystyrene sulfonate (PEDOT:PSS@Chl) material. The solar cell further includes a fourth layer including a silver material, and a fifth layer including a silica material. The PEDOT:PSS@Chl material includes chlorophyll in an amount of 4 to 12 percent by weight (wt. %) based on a total weight of the PEDOT:PSS@Chl material. The PEDOT:PSS@Chl material has a surface area of 500 to 550 meter square per gram ($m^2/g$). The third layer has a thickness of 30 to 70 nanometer (nm).

20 Claims, 6 Drawing Sheets

(56) References Cited

OTHER PUBLICATIONS

Lestari et al., 2017 IOP Conf. Ser.: Mater. Sci. Eng., 176, 012009. (Year: 2017).*

B. Bita et al., "On the Electrical and Photo-Electrical Behavior of the Photovoltaic Cells Based pn Polymeric and Chlorophyll-A Thin Films", Proceedings of the Romanian Academy, Series A, vol. 20, No. Jan. 2019 , 2019. pp. 51-57 (8 pages).

Je-Jung Yun et al., "Chlorophyll-layer-inserted poly(3-hexylthiophene) solar cell having a high light-to-current conversion efficiency up to 1.48%", Appl. Phys, Lett. 87. 123102, 2005 {4 pages).

N. Ishak et al.. "Hybrid solar cell using conjugated chlorophyll from pandanus amaryllifolius as photosensitizers". International Journal of Recent Technology and Engineering (IJRTE), Nov. 2018 (7 pages).

Yue Li et al., "Chlorophyll-Based Organic-Inorganic Heterojunction Solar Cells", Chemistry—A European Journal / vol. 23, Issue 45, Jun. 3, 2017 (10 pages).

Ziu Zang et al., "Enhanced Charge Separation and Short-Circuit Current by Doping with Chlorophyll in Cascaded Ternary Solar Cells". ACS Publications, Mar. 12. 2024 (6 pages).

\* cited by examiner

CHLOROPHYLL-INFUSED POLY(3,4-ETHYLENEDIOXYTHIOPHENE): POLYSTYRENE SULFONATE LAYER-BASED PHOTOVOLTAIC SOLAR CELL

BACKGROUND

Technical Field

The present disclosure is directed towards a solar cell, and more particularly, directed towards a photovoltaic solar cell with a chlorophyll-infused poly(3,4-ethylenedioxythiophene):polystyrene sulfonate layer (PEDOT:PSS@Chl).

Description of Related Art

The "background" description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Conducting polymers are widely used in optoelectronic and photovoltaic applications due to their electrical conductivity, optical properties, and flexibility. These conducting polymers have been developed for use in devices such as organic light-emitting diodes (OLEDs), organic photovoltaic cells (OPVs), sensor technology, displays, and the like. They offer advantages such as low-cost fabrication processes, lightweight and flexible structures, and a potential for large-scale manufacturing; however, single conducting polymers in solar cells have limitations that reduce efficiency and performance. One such difficulty is a low power conversion efficiency compared to traditional silicon solar panels. Furthermore, these polymers can exhibit photochemical instability, resulting in a shorter operating lifetime than their inorganic counterparts. Lack of efficient protective coatings can contribute to environmental degradation, which worsen existing problems. Composite polymers infused with natural pigments may offer greater light absorption and durability, enhance their absorption spectrum, and provide environmental benefits, making the technology more sustainable. Poly(3,4-ethylenedioxythiophene) (PEDOT) doped with polystyrene sulfonate (PSS), commonly called PEDOT:PSS, is a conducting polymer composite widely used due to high conductivity, transparency, and stability. The properties of PEDOT:PSS make it suitable for applications using electrical conductivity. PEDOT can also be combined with other materials to enhance performance in various optoelectronic devices.

PEDOT:PSS is used as a transparent conductive electrode in organic solar cells (OSCs) and perovskite solar cells due to their good electrical conductivity. The transparent nature of PEDOT:PSS allows for efficient light transmission, contributing to the overall light harvesting efficiency of the solar cell. By serving as a charge collection layer, PEDOT:PSS facilitates the extraction and transport of photogenerated charge carriers, enhancing the device's power conversion efficiency. Mixing activated biochar (A-BC) extracted from red sea green algae (chlorophyta), known for unique biological and biochemical properties, with traditional chemicals presents an innovative approach in solar cell and energy technology by enhancing the performance and efficiency of solar cells and increasing energy conversion capabilites [Alsharif, M. A. et al., Zinc-bis-8-hydroxyquinoline doped by biochar extracted from red sea algae Chlorophyta as a novel photoactive layer in heterojunction solar cells, *Alexandria Engineering Journal*, 2023, 78, 307-317]. Additionally, the bioactive compounds present in red sea green algae may improve the stability and longevity of the solar cell, protecting it against degradation and environmental factors.

Incorporating chlorophyll (Chl) extracted from algae can enhance the efficiency and sustainability of PEDOT:PSS thin-film solar cells. Modifying PEDOT:PSS with alkyl diamines improves conductivity and device performance, achieving a power conversion efficiency of 18.44% in binary organic solar cells [Liang, W. et al., Enhancing Efficiency of Organic Solar Cells with Alkyl Diamines Doped PEDOT/PSS, *ACS Materials Letters*, 2023, 5, 3, 656-663]. Applying a multi-walled carbon nanotube network coated with polydopamine as an interlayer between a silicon substrate and a PEDOT:PSS film enhances an antireflection ability, charge separation, and junction effect, resulting in a power conversion efficiency of 12.49% in Si/PEDOT:PSS heterojunction solar devices [Guo, H. et al., Enhanced performance of Si/PEDOT/PSS heterojunction solar cells via multi-walled carbons coated with polydopamine *Optical Materials*, 2021, 120, 111375]. Post-treating PEDOT:PSS films with dimethyl sulfoxide improves conductivity and reduces series resistance, increasing power conversion efficiency from 5.95% to 6.52% in polymer solar cells [Wang, M. et al., Enhanced polymer solar cells efficiency by surface coating of the PEDOT/PSS with polar solvent, *Solar Energy*, 2016, 129, 175-183]. Introducing a 50 nm PEDOT:PSS layer thickness improves hole collection at the metal/active layer interface, leading to better solar cell performance [Hussein, A. A. et al., Enhancement efficiency of polymer solar cells by incorporating metal oxide nanoparticles, *Chem. Mater. Research*, 2014, 6, 79-85].

Although several polymer composite materials have been developed in the past for photovoltaic solar cells, there still exists a need to develop efficient, cost-effective solar cells using composite materials infused with natural pigments (e.g., Chl). Accordingly, an objective of the present disclosure is to develop a photovoltaic solar cell with a chlorophyll-infused poly(3,4-ethylenedioxythiophene):polystyrene sulfonate layer (PEDOT:PSS@Chl) that may improve the efficiency of solar cells through enhanced light absorption and energy conversion rates.

SUMMARY

In an exemplary embodiment, a solar cell is described. The solar cell includes a first layer including a silica material, a second layer including an indium tin oxide material, and a third layer including a chlorophyll-doped poly(3,4-ethylenedioxythiophene):polystyrene sulfonate (PEDOT:PSS@Chl) material. The solar cell further includes a fourth layer including a silver material, and a fifth layer including a silica material. The PEDOT:PSS@Chl material includes chlorophyll (Chl) in an amount of 4 to 12 percent by weight (wt. %) based on a total weight of the PEDOT:PSS@Chl material. The PEDOT:PSS@Chl material has a surface area of 500 to 550 meter square per gram ($m^2/g$). The third layer has a thickness of 30 to 70 nanometer (nm).

In some embodiments, the PEDOT:PSS@Chl material is porous and has a cumulative surface pore volume of 0.05 to 0.15 cubic centimeter per gram ($cm^3/g$). In some embodiments, the third layer consists of the chlorophyll and the poly(3,4-ethylenedioxythiophene):polystyrene sulfonate. In some embodiments, the chlorophyll is homogeneously dispersed in a matrix of poly(3,4-ethylenedioxythiophene):polystyrene sulfonate. In some embodiments, the second layer is directly adjacent and continuous with a first side of the third layer and the fourth layer is directly adjacent and continuous with a second side of the third layer. In some embodiments, the chlorophyll is present only in the third layer.

In some embodiments, the PEDOT:PSS@Chl material is porous and has a pore diameter of 60 to 70 angstrom (Å).

In some embodiments, a thermogravimetric analysis (TGA) weight of the PEDOT:PSS@Chl material is 10 to 20 percent (%) greater than a TGA weight of the same PEDOT:PSS@Chl material without the chlorophyll up to a temperature of 600 degrees Celsius (° C.).

In some embodiments, the PEDOT:PSS@Chl material has a 15 to 25% increase in light transmission compared to the same PEDOT:PSS@Chl material without the chlorophyll.

In some embodiments, the solar cell has a power conversion efficiency of 10 to 15%.

In some embodiments, the solar cell has a short-circuit current density of 25 to 35 milliamperes per square centimeter ($mA/cm^2$).

In some embodiments, the solar cell has an open-circuit voltage of 0.5 to 0.7 volts (V).

In some embodiments, the solar cell has a fill factor of 55 to 65%.

In some embodiments, the third layer has a thickness of 40 to 60 nm.

In some embodiments, the third layer has a thickness of 45 to 55 nm.

In some embodiments, the third layer is in the shape of agglomerated spherical nanoparticles having a diameter of 30 to 300 nm.

In some embodiments, the PEDOT:PSS@Chl material includes chlorophyll in an amount of 9 to 11 wt. % based on a total weight of the PEDOT:PSS@Chl material.

In some embodiments, the chlorophyll is dispersed in a poly(3,4-ethylenedioxythiophene) (PEDOT) and polystyrene sulfonate (PSS) network.

In some embodiments, the chlorophyl is dispersed in the poly(3,4-ethylenedioxythiophene) and polystyrene sulfonate network through 7E-7E stacking interactions.

In some embodiments, a weight ratio of poly(3,4-ethylenedioxythiophene) to polystyrene sulfonate is from 1:1 to 1:10.

In some embodiments, the PEDOT:PSS@Chl material is spin coated on to the second layer.

In another exemplary embodiment, a method of converting light energy into electrical energy is described. The method includes illuminating the solar cell with light, exciting electrons in the third layer, and collecting excited electrons to generate electrical energy.

In some embodiments, the fourth layer has a thickness of 20 to 80 nm.

In some embodiments, the second layer has a thickness of 20 to 200 nm.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

When describing the present disclosure, the terms used are to be construed in accordance with the following definitions, unless a context dictates otherwise.

Embodiments of the present disclosure will now be described more fully hereinafter with reference to the accompanying drawings wherever applicable, in that some, but not all embodiments of the disclosure are shown.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

As used herein, the term "compound" refers to a chemical entity, regardless of its phase (solid, liquid, or gas) and/or state (i.e., crude mixture, purified, isolated, and the like).

As used herein, the term "particle" refers to a portion of matter that is part of a whole. Particles may have similar or different properties (i.e., density, volume, mass, and the like) to the whole.

As used herein, the term "particle size" may be considered the length or longest dimension of a particle. The greatest distance that can be measured from one point on a shape through its center to a point directly across from the one point is referred to as the "diameter" for a circle, oval, ellipse, and multilobe. In the present disclosure, "particle size" and "particle diameter" are used interchangeably.

As used herein, the term "nanoparticles (NPs)" refers to particles having a particle size of 1 nanometer (nm) to 500 nm within the scope of the present disclosure.

As used herein, the term "porosity" refers to a measure of the void or vacant spaces within a material.

As used herein, the term "pore diameter" may be thought of as the length or longest dimension of a pore opening.

As used herein, "pore volume" refers to a total volume of empty spaces or pores within a material.

As used herein, the term "room temperature" refers to a temperature range of 25 degrees Celsius (° C.)±3° C. in the present disclosure.

As used herein, the term "ultrasonication" or "sonication" refers to a process in which sound waves are used to agitate particles in a solution.

As used herein, the term "electrode" refers to an electrical conductor used to contact a non-metallic part of a circuit (i.e., a semiconductor, an electrolyte, a vacuum, or air).

As used herein, the term "current density" refers to an amount of current traveling per unit cross-section area.

As used herein, the term "solar cell" or "photovoltaic cell," refers to a non-mechanical device that converts sunlight directly into electricity.

As used herein, the term "organic solar cells (OSCs)" refers to a third-generation photovoltaic technology that uses organic polymers to convert sunlight into electricity.

As used herein, the term "fill factor" refers to an electrical parameter of a solar cell that measures performance and efficiency. The fill factor may be calculated by dividing a maximum power output of a solar cell by its actual power output.

As used herein, the term "power conversion efficiency (PCE)" refers to the ratio of light energy converted to usable electrical energy. PCE can be represented by a percentage of solar energy that is converted into electricity by the solar cells.

As used herein, the term "energy conversion rates" refers to the efficiency of converting energy from one form to another. An energy conversion rate is also known as an energy conversion efficiency and is a ratio of an output of an energy conversion device (such as a solar cell) to its input. The input and output can be in the form of chemical, mechanical, electrical, light, or heat energy.

A weight percent of a component, unless specifically stated to the contrary, is based on a total weight of the formulation and/or composition in which the component is included. For example, if a particular element or component in a composition or article is said to have 5 wt. %, it is understood that this percentage is in relation to a total compositional percentage of 100%.

The present disclosure is intended to include all hydration states of a given compound or formula, unless otherwise noted or when heating a material.

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium, and isotopes of carbon include $^{13}C$ and $^{14}C$. Isotopically labeled compounds of the disclosure may generally be prepared by conventional techniques known to those skilled in the art or by processes analogous to those described herein, using an appropriate isotopically-labeled reagent in place of the non-labeled reagent otherwise employed.

Aspects of the present disclosure are directed toward a solar cell based on a chlorophyll-doped poly(3,4-ethylenedioxythiophene):polystyrene sulfonate (PEDOT:PSS@Chl) composite material using chlorophyll (Chl) extracted from green algae (existing in the Neom coast in the Kingdom of Saudi Arabia (KSA)). The fabricated material of the present disclosure augments solar cell efficiency by increasing light absorption and energy conversion rates. This includes a sustainable approach, is cost-effective, and uses simple and less toxic chemicals than traditional methods.

A solar cell is described. The solar cell includes a first layer including a silica material, a second layer including an indium tin oxide (ITO) material, a third layer including a chlorophyll-doped poly(3,4-ethylenedioxythiophene):polystyrene sulfonate (PEDOT:PSS@Chl) material, a fourth layer including a silver material, and a fifth layer including a silica material.

Due to its high efficiency and affordability, silica/its derivatives are used as a substrate or buffer layer in solar technology. Further, silica is inert and chemically stable, which helps maintain long-term integrity of solar cell components and slows degradation. The high thermal stability of silica allows it to survive high temperatures without losing performance. The light scattering properties of silica can also boost photon absorption within the cell. These functions increase solar cell longevity and efficiency. In some embodiments, other substrates, such as glass, silicon wafers, metal foils, plastic (PET and polyimide), and germanium, can also be used in combination or in place of the silica material. In some embodiments, the silica material may be doped and/or coated with a material to increase the efficiency of the solar cell.

The second layer of the solar cell includes an ITO material. ITO coatings offer several benefits in solar cells, including, but not limited to, high optical transparency, allowing maximum sunlight to penetrate for efficient energy conversion, and excellent electrical conductivity, facilitating effective charge carrier collection while minimizing resistive losses. ITO is chemically stable and oxidation resistant, making it suitable for long-term use in various environments. In the present disclosure, ITO is acting as an anode.

In some embodiments, alternative anodes to ITO, such as fluorine-doped tin oxide (FTO), aluminum-doped tin oxide (AZO), silver nanowires, carbon nanotubes, graphene, graphene oxide, metal meshes, conductive oxides, a combination thereof, and the like, may be used in the second layer. In some embodiments, the ITO material may be doped and/or coated with a material to increase the efficiency of the solar cell. In some embodiments, the second layer has a thickness of 20-200 nanometers (nm), preferably 30-190 nm, preferably 40-180 nm, preferably 50-170 nm, preferably 60-160 nm, preferably 70-150 nm, preferably 80-140 nm, preferably 90-130 nm, and preferably 100-120 nm. In other embodiments, the second layer may have a thickness greater than 200 nm.

The third layer of the solar cell includes the PEDOT:PSS@Chl material. The poly(3,4-ethylenedioxythiophene):polystyrene sulfonate (PEDOT:PSS) composite is a highly conductive and transparent polymer commonly used as a transparent electrode in organic and perovskite solar cells. Its features allow for effective light transmission and improved extraction of photogenerated charge carriers, increasing the overall power conversion efficiency of the devices. In some embodiments, the weight ratio of PEDOT to PSS is from 1:1 to 1:10, preferably 1:2 to 1:9, preferably 1:3 to 1:8, preferably 1:4 to 1:7, and preferably 1:5 to 1:6.

Incorporating chlorophyll (Chl) in PEDOT:PSS (forming PEDOT:PSS@Chl) can enhance the light-harvesting capabilities of the material, leading to increased light absorption and higher energy conversion efficiency in solar cells. Chl is a viable material for fabricating solar cells because of its natural capacity to absorb sunlight and transform it into energy via photosynthesis. By utilizing a natural and cost-effective material like Chl, the composite of the present disclosure offers an affordable solution for enhancing solar cell performance over traditional additives. Using Chl from Neom coast green algae promotes environmental sustainability by reducing dependence on synthetic materials and offering a renewable and eco-friendly alternative for enhancing solar cell technology. Optical properties of the PEDOT:PSS material can be improved by incorporating Chl, resulting in better overall performance and output of the solar cells. The inexpensive fabrication methods and sustainable materials create opportunities for scalability and widespread adoption in the solar energy industry, facilitating the development of more accessible and environmentally conscious solar cell technologies.

In some embodiments, chlorophyll (Chl) is dispersed in the PEDOT and PSS network. The Chl may be dispersed in the PEDOT and PSS network using a suitable technique like ultrasonication, solvent casting, emulsion technique, high-shear mixing, micro-fluidization, coacervation, electrospinning, and spray drying. In some embodiments, the chlorophyll is dispersed in the PEDOT and PSS network evenly and homogeneously. In other embodiments, the chlorophyll may be dispersed in the PEDOT and PSS network in a non-homogeneous manner, i.e., clusters of chlorophyll in areas of the PEDOT and PSS network along with areas of the PEDOT and PSS network with no chlorophyll. In some embodiments, the Chl is dispersed in the PEDOT and PSS network through 7L-7L stacking interactions. The aromatic rings in Chl interact with the PEDOT and PSS polymer matrix, increasing compatibility and stability. This contact helps keep Chl intact while allowing dispersion in the polymer solution.

In some embodiments, the PEDOT:PSS@Chl material includes Chl in an amount of 4-12 percent by weight (wt. %), preferably 5-11 wt. %, preferably 6-10 wt. %, and preferably 7-9 wt. % based on the total weight of the PEDOT:PSS@Chl material. In some embodiments, the PEDOT:PSS@Chl material includes Chl in an amount of 9-11 wt. %, preferably 9.5-10.5 wt. %, and more preferably about 10 wt. % based on the total weight of the PEDOT:PSS@Chl material. In a preferred embodiment, the PEDOT:PSS@Chl material includes Chl in an amount of 10 wt. % in the solar cell.

In some embodiments, the third layer is in the shape of agglomerated spherical nanoparticles (NPs). In alternate embodiments, the third layer may exist in the shape of wires, spheres, crystals, rectangles, triangles, pentagons, hexagons, prisms, disks, cubes, ribbons, blocks, beads, discs, barrels, granules, whiskers, flakes, foils, powders, boxes, stars, tetrapods, belts, flowers, mixtures thereof, and the like.

In some embodiments, the third layer is in the shape of agglomerated spherical NPs having a diameter of 30-300 nm, preferably 30-290 nm, preferably 40-280 nm, preferably 50-270 nm, preferably 60-260 nm, preferably 70-250 nm, preferably 80-240 nm, preferably 90-230 nm, preferably 100-220 nm, preferably 110-210 nm, preferably 120-200 nm, preferably 130-190 nm, preferably 140-180 nm, and preferably 150-170 nm.

In some embodiments, the third layer has a thickness of 30-70 nm, preferably 35-65 nm, more preferably 40-60 nm, and yet more preferably 45-55 nm. In some embodiments, the third layer has a thickness of 40-60 nm, preferably 41-59 nm, preferably 42-58 nm, preferably 43-57 nm, preferably 44-56 nm, preferably 45-55 nm, preferably 46-54 nm, preferably 47-53 nm, more preferably 48-52 nm, and yet more preferably 49-51 nm. In some embodiments, the third layer has a thickness of 45-55 nm, preferably 46-54 nm, preferably 47-53 nm, more preferably 48-52 nm, and yet more preferably 49-51 nm. In a preferred embodiment, the third layer has a thickness of about 50 nm.

In some embodiments, the PEDOT:PSS@Chl material is porous. A porous material is the one that forms a porous bulk solid. Pores may be micropores, mesopores, macropores, and/or a combination thereof. The pores exist in the bulk material, and not necessarily in the molecular structure of the material. The term "microporous" refers to pores of a material (i.e., the PEDOT:PSS@Chl material) having an average pore width (i.e., diameter) of less than 2 nm. The term "mesoporous" refers to pores of a material having an average pore width of 2-50 nm. The term "macroporous" refers to pores of a material having an average pore width larger than 50 nm. Pore size may be determined by methods including, but not limited to, gas adsorption (e.g., $N_2$ adsorption), mercury intrusion porosimetry, imaging techniques, such as scanning electron microscopy (SEM) and X-ray computed tomography (XRCT), and the like.

In some embodiments, the PEDOT:PSS@Chl material is porous and has a pore diameter of 60-70 angstrom (Å), preferably 62-69 Å, preferably 64-68 Å, more preferably 65-67 Å, and yet more preferably 66-67 Å. In a preferred embodiment, the PEDOT:PSS@Chl material has a pore diameter of about 66.56 Å. In some embodiments, the PEDOT:PSS@Chl material has a cumulative surface pore volume of 0.05-0.15 cubic centimeter per gram ($cc^3/g$), preferably 0.06-0.14 $cc^3/g$, preferably 0.07-0.13 $cc^3/g$, more preferably 0.08-0.12 $cc^3/g$, and yet more preferably 0.09-0.11 $cc^3/g$. In a preferred embodiment, the PEDOT:PSS@Chl material has a cumulative surface pore volume of about 0.0992 $cc^3/g$.

The Brunauer-Emmett-Teller (BET) measurement provides information on the specific surface area of a material. It describes the physical adsorption of gas molecules on a solid surface. Specific surface area is a property of solids, which is the total surface area of a material per unit of mass, solid or bulk volume, and/or cross-sectional area. In some embodiments, pore diameter, pore volume, and BET surface area are measured by gas adsorption analysis, preferably $N_2$ adsorption analysis (e.g., $N_2$ adsorption isotherms). In some embodiments, the PEDOT:PSS@Chl material has a surface area of 500-550 meter square per gram ($m^2/g$), preferably 505-545 $m^2/g$, preferably 510-540 $m^2/g$, more preferably 515-535 $m^2/g$, and yet more preferably 520-530 $m^2/g$. In a preferred embodiment, the PEDOT:PSS@Chl material has a surface area of about 522 $m^2/g$.

In some embodiments, the PEDOT:PSS@Chl material is spin-coated onto the second layer. In alternate embodiments, the PEDOT:PSS@Chl material may be deposited onto the second layer using one of the techniques from the drop-casting method, spray coating, dip coating, physical vapor deposition (PVD), aerosol-assisted chemical vapor deposition (AACVD), molecular beam epitaxy (MBE), and/or any other methods known in the art.

Furthermore, the solar cell has a fourth layer, which includes a silver material. Silver in a solar cell serves as a conductive electrode (cathode), efficiently collecting and transmitting the electrical current created. The reflecting characteristics of silver improve light absorption in the solar cell. This combination increases the overall efficiency and performance of the solar cell. In some embodiments, any cathode known in the art may be used in combination with or in place of the silver. In some embodiments, the fourth layer has a thickness of 20-80 nm, preferably 25-75 nm, preferably 30-70 nm, preferably 35-65 nm, preferably 40-60 nm, and preferably 45-55 nm. In other embodiments, the fourth layer may have a thickness greater than 80 nm. The solar cell also includes a fifth layer including a silica material. In some embodiments, other substrates, such as glass, silicon wafers, metal foils, plastic (PET and polyimide), and germanium, may also be used in combination or in place of the silica material. In some embodiments, the silica material may be doped and/or coated with a material to increase the efficiency of the solar cell.

Figure 1:
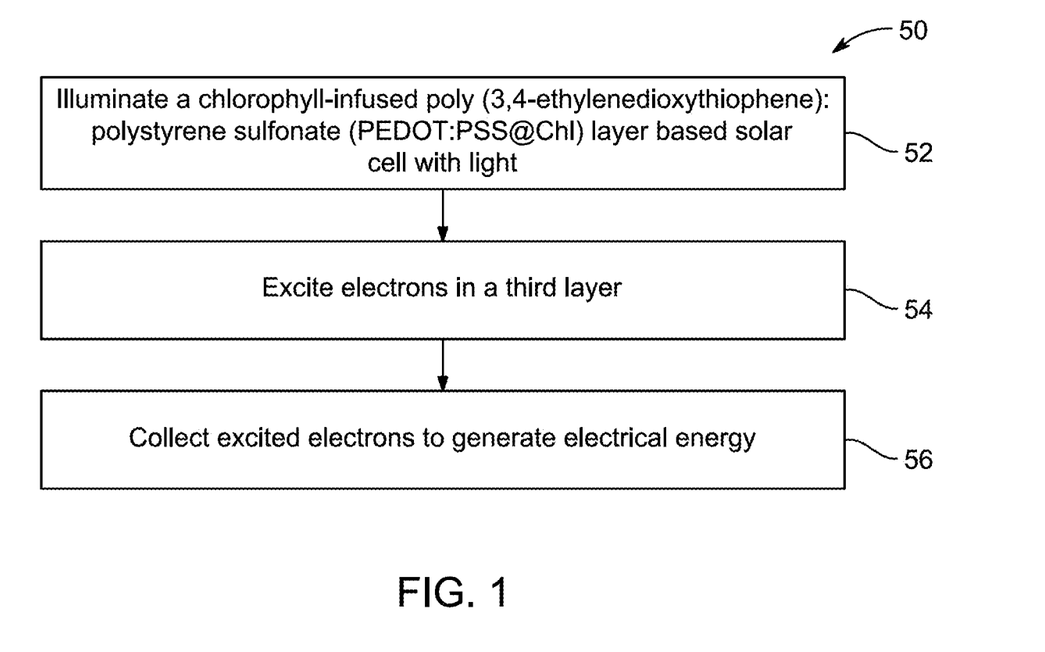
FIG. 1 is a flow chart of a method of converting light energy into electrical energy, according to certain embodiments.

FIG. 1 illustrates a flow chart of a method 50 of converting light energy into electrical energy. The order in which the method 50 is described is not intended to be construed as a limitation, and any number of the described method steps can be combined in any order to implement the method 50. Additionally, individual steps may be removed or skipped from the method 50 without departing from the spirit and scope of the present disclosure.

At step 52, the method 50 includes illuminating a PEDOT:PSS@Chl layer based solar cell with light. The PEDOT:PSS@Chl layer based solar cell can be exposed to different light sources to generate electricity via the photovoltaic effect, in which light photons excite electrons in the cell. The light source can be sunlight, ultraviolet (UV) light, visible light, infrared (IR) light, laser light, X-rays, and the like. Suitable examples of light sources include LED lights, halogen bulbs, fluorescent lights, incandescent bulbs, and the like.

At step 54, the method 50 includes exciting electrons in a third layer (i.e., the PEDOT:PSS@Chl material layer). Exciting electrons is the process by which photons from light energy strike atoms in a substance, delivering enough energy to raise electrons from their ground state to a higher energy level. In solar cells, this excitation generates electron-hole pairs, which are used to generate electric current. The effectiveness of this process is determined by the wavelength of the light and the material qualities which allow it to convert light energy into electrical energy.

At step 56, the method 50 includes collecting excited electrons to generate electrical energy. The excited electrons are collected by capturing the free electrons generated when light photons excite electrons in a solar cell. When these electrons become excited, they flow through the material, generating an electric current. An internal electric field sends excited electrons to the front contact of the solar cell and holes to the rear contact, resulting in a flow of electricity through an external circuit that produces usable electrical energy.

In some embodiments, the solar cell has a short-circuit current density ($J_{SC}$) of 25-35 milliamperes per square centimeter (mA/cm$^2$), preferably 26-34 mA/cm$^2$, preferably 27-33 mA/cm$^2$, more preferably 29-32 mA/cm$^2$, and yet more preferably 30-32 mA/cm$^2$. In a preferred embodiment, the solar cell has a $J_{SC}$ of about 31.37 mA/cm$^2$. In some embodiments, the solar cell has an open-circuit voltage of 0.5-0.7 volts (V), preferably 0.55-0.65 V, and more preferably 0.60-0.62 V. In a preferred embodiment, the solar cell has an open-circuit voltage of about 0.61 V. In some embodiments, the solar cell has a fill factor of 55-65%, preferably 56-64%, preferably 57-63%, preferably 59-62%, and preferably 60-62%. In a preferred embodiment, the solar cell has a fill factor of about 61%. In some embodiments, the solar cell has a PCE of 10-15%, preferably 11-14%, and preferably 12-13.5%. In a preferred embodiment, the solar cell has a PCE of about 13.02%.

In some embodiments, the TGA weight of the PEDOT:PSS@Chl material is 10-20%, preferably 11-19%, preferably 12-18%, preferably 13-17%, and preferably 14-16%, greater than the TGA weight of the same PEDOT:PSS@Chl material without the Chl (i.e., PEDOT:PSS) up to a temperature of 600 degrees Celsius (° C.), preferably 550° C., preferably 500° C., and preferably 450° C. In a preferred embodiment, the TGA weight of the PEDOT:PSS@Chl material including 10 wt. % Chl is about 12% greater than the TGA weight of the same PEDOT:PSS@Chl material without the Chl (i.e., PEDOT:PSS) up to a temperature of about 600° C. In some embodiments, the PEDOT:PSS@Chl material has a 15-25%, preferably 16-24%, preferably 17-23%, preferably 18-22%, and preferably 19-21% increase in light transmission compared to the same PEDOT:PSS@Chl material without the Chl (i.e., PEDOT:PSS).

EXAMPLES

The following examples describe and demonstrate a photovoltaic solar cell utilizing a chlorophyll-infused poly(3,4-ethylenedioxythiophene):polystyrene sulfonate layer (PEDOT:PSS@Chl). The examples are provided solely for illustration and are not to be construed as limitations of the present disclosure, as many variations thereof are possible without departing from the spirit and scope of the present disclosure.

Example 1: Experimental Procedure

The use of chlorophyll (Chl) provides a sustainable and cost-effective solution that enhances the efficiency of solar cells and promotes environmental benefits through the use of renewable resources. By combining natural and synthetic materials, the solar cell of the present disclosure represents an advancement in solar energy technology with the potential for widespread application and impact.

Figure 2:
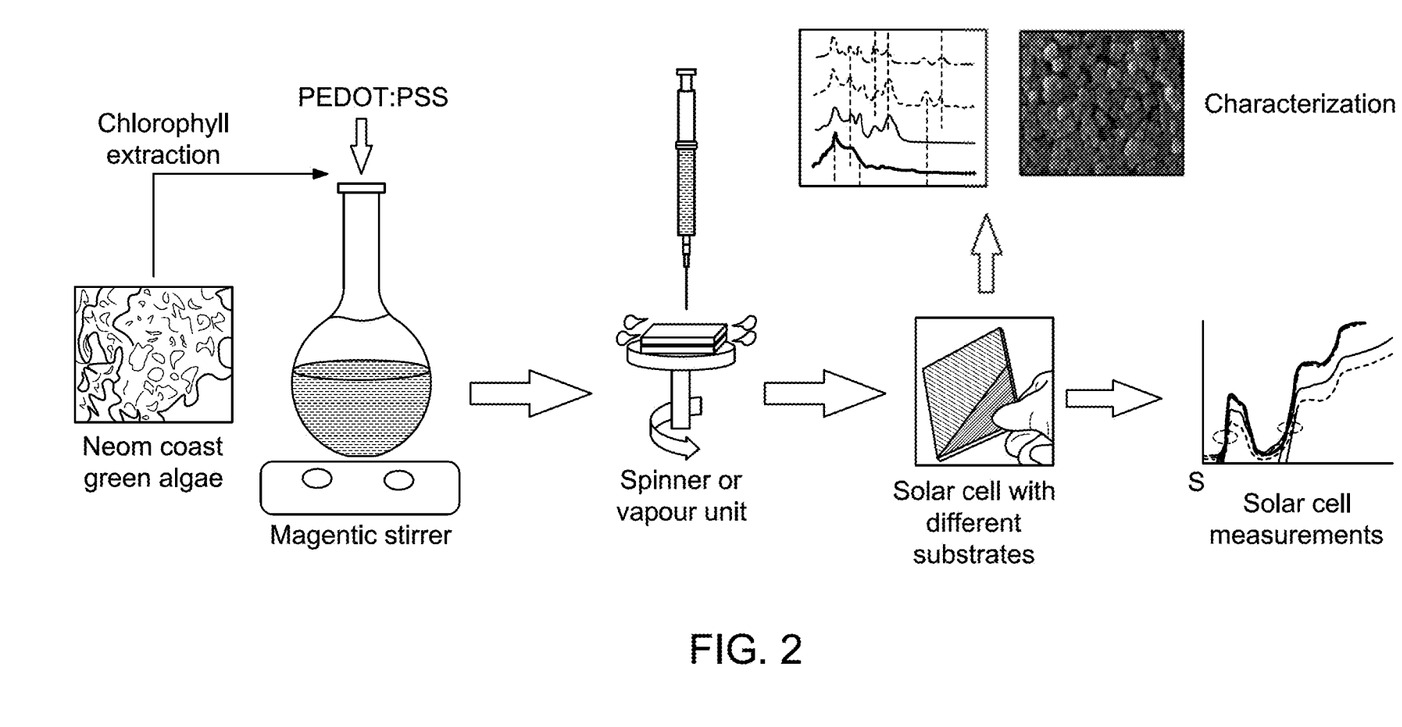
FIG. 2 is a schematic illustration of a process depicting synthesis and application of a chlorophyll-infused poly(3,4-ethylenedioxythiophene):polystyrene sulfonate (PEDOT:PSS@Chl) layer-based solar cell, according to certain embodiments.

To incorporate Chl from Neom Coast green algae into a poly(3,4-ethylenedioxythiophene):polystyrene sulfonate (PEDOT:PSS) layer, algae are harvested and rinsed free from impurities. The chlorophyll is then extracted from the algae and concentrated. Next, a homogeneous solution of PEDOT and PSS is prepared in dimethylformamide (DFM). Once homogeneity is achieved, the calculated amount of Chl extract is added to the PEDOT:PSS solution at a concentration of 10 wt. %, and the solution is thoroughly mixed until the Chl is uniformly incorporated into the PEDOT:PSS. To confirm the desired effects, optical and electronic properties of the Chl-doped PEDOT:PSS (PEDOT:PSS@Chl) mixture are measured, and if necessary, the concentration of Chl may be varied to achieve desired performance in terms of light absorption and electrical conductivity. Following this, the Chl-doped PEDOT:PSS is applied onto different substrates using a spinner or coating unit, allowing the layer to dry and form a uniform film, and finally, the Chl-doped PEDOT:PSS layer (PEDOT:PSS@Chl) is integrated into the solar cell structure. FIG. 2 demonstrates a schematic illustration of a process showing synthesis and application of PEDOT:PSS@Chl-based solar cell.

Example 2: Characterization

The structural investigation of the PEDOT:PSS@Chl is done using different characterization techniques. The crystallinity of the prepared samples was analyzed using X-ray diffraction (XRD) on a Shimadzu X-ray diffractometer (Cu Kα –1.541 angstrom (Å)) with a scan rate of 20 degrees per minute (°/min) in the range between 200 and 2500 nanometer (nm). An optical ultraviolet-visible (UV-Vis) spectrophotometer (Shimadzu UV-2600 or PerkinElmer Lambda 750) was utilized to measure the structural and optical properties. The surface functionalities of PEDOT:PSS@Chl were characterized by Fourier-transform infrared (FTIR) spectroscopy. The textural characteristics were characterized through nitrogen (N2) adsorption-desorption isotherm using a Brunauer Emmett Teller (BET) surface area analyzer. The thermal stability of the material was gauged through thermogravimetric analysis (TGA). Scanning electron microscopy (SEM) was employed to characterize the surface morphology of the PEDOT:PSS@Chl material. The current density-voltage (J-V) characteristics were measured with an electrometer (Keithley 2470) linked to a computer via special software. Three cells (PEDOT:PSS, PEDOT:PSS@5 wt. % Chl, and PEDOT:PSS@10 wt. % Chl) were exposed to constant white light from a halogen lamp (FO7 Philips 6423). The J-V measurements were taken with an illumination intensity of 100 milliwatt per square centimeter (mW/cm$^2$), controlled by a solar power meter (TENMARS TM-206-TM206). All measurements were performed in ambient air at room temperature.

Example 3: Structural Characteristics

Mixing PEDOT:PSS with Chl as the active layer in the solar cell impacts charge transfer and cell efficiency. This is due to specific functional groups that may be formed in the PEDOT:PSS@Chl material. PEDOT:PSS, a conductive polymer, offers good electrical conductivity, while Chl is a potent light-absorbing organic molecule. Blending these materials creates favorable 7L-7L stacking interactions and hydrogen bonding, enhancing the stability of Chl within the polymer matrix. C=C Stretch (alkene) is observed at 1540 cm$^{-1}$ (wavenumbers), C—O stretch (ether) is observed at 1020 cm$^{-1}$, C—H bending (aromatic) is observed at 920 cm$^{-1}$, C=O stretch (carbonyl) is observed at 1750 cm$^{-1}$, C—H stretch (alkyl and aromatic) is observed at 2900 cm$^{-1}$, C≡C Stretch is observed at 1620 cm$^{-1}$, and N—H Stretch (if present in Chl) is observed at 3300-3400 cm$^{-1}$.

This interaction facilitates the efficient transfer of excitons generated in the Chl upon light absorption and promotes enhanced charge mobility within the composite film. As a result, the combination of PEDOT:PSS and Chl in solar cells is thought to lead to improved charge separation and collection efficiency, enhancing the overall energy conversion efficiency of the solar cells. Utilizing a sustainable material like Chl in conjunction with PEDOT:PSS supports environmental goals and contributes to the development of greener, more efficient photovoltaic technologies.

Chl derived from green algae, when incorporated within the PEDOT:PSS composite (PEDOT:PSS@Chl), can act as a conductive filler within the composite, potentially enhancing its optical conductivity. The structure of Chl can also serve as a scaffold for the PEDOT:PSS, promoting better interfacial adhesion between the components.

The targeted sample (PEDOT:PSS @10 wt. % Chl) was subjected to degassing at 80 degrees Celsius (° C.) for 8 hours (h). The BET surface analysis showed a value of 522 meters square per gram (m$^2$/g). The cumulative surface pore volume was measured to be 0.0992 cc$^3$/g. The pore diameter was found to be 66.56 Å, which suggests a high pore space within the doped sample. A high surface area provides more active sites for chemical reactions in photocatalysis and enhances the optical and electrical properties. Similarly, the measured cumulative surface pore volume of 0.0992 cubic centimeters per gram (cc$^3$/g) suggests the presence of pores that can facilitate ion transport.

Figure 3:
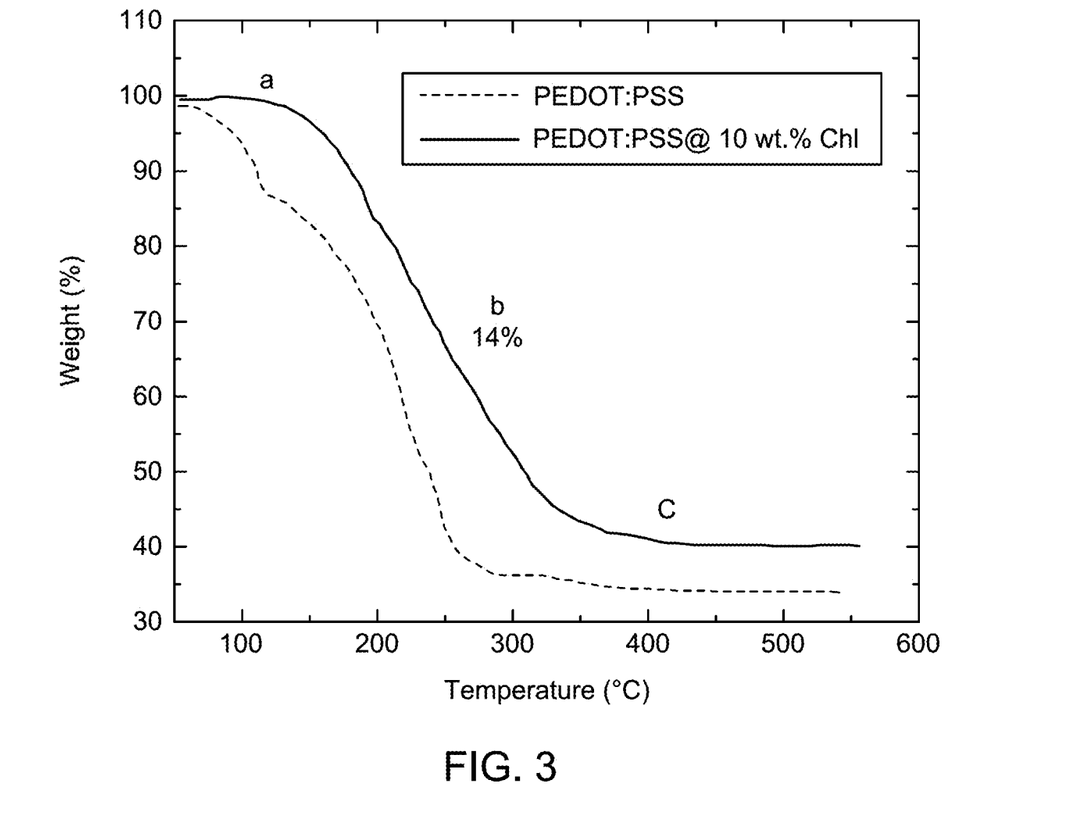
FIG. 3 depicts thermogravimetric analysis (TGA) for PEDOT:PSS and PEDOT:PSS@Chl with 10 weight percent (wt. %) chlorophyll, according to certain embodiments.

TGA is an analytical technique that can help evaluate the suitability of materials for use in photocatalytic and photoelectric applications. FIG. 3 is a plot showing TGA analysis for PEDOT:PSS and PEDOT:PSS@10 wt. % Chl. The doped sample exhibits a greater thermal stability than the undoped sample up to 600° C. The weight loss improvement is about 12% more stability after Chl doping by 10 wt. %. The combination of Chl with PEDOT:PSS opens up the possibility of synergistic effects between the two materials, leading to a composite with tailored properties. The interactions between Chl and PEDOT:PSS can result in a composite material that exhibits improved conductivity, structural integrity, and potentially other desirable characteristics for various applications.

Figure 4:
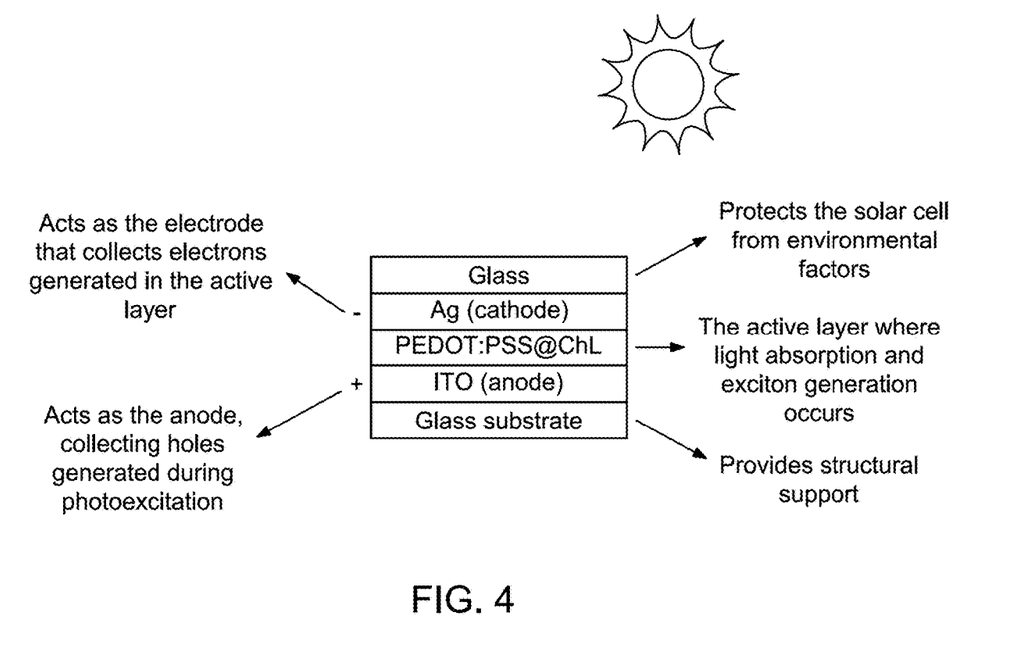
FIG. 4 shows a schematic illustration of different components of the PEDOT:PSS@Chl layer-based solar cell, according to certain embodiments.
Figure 5:
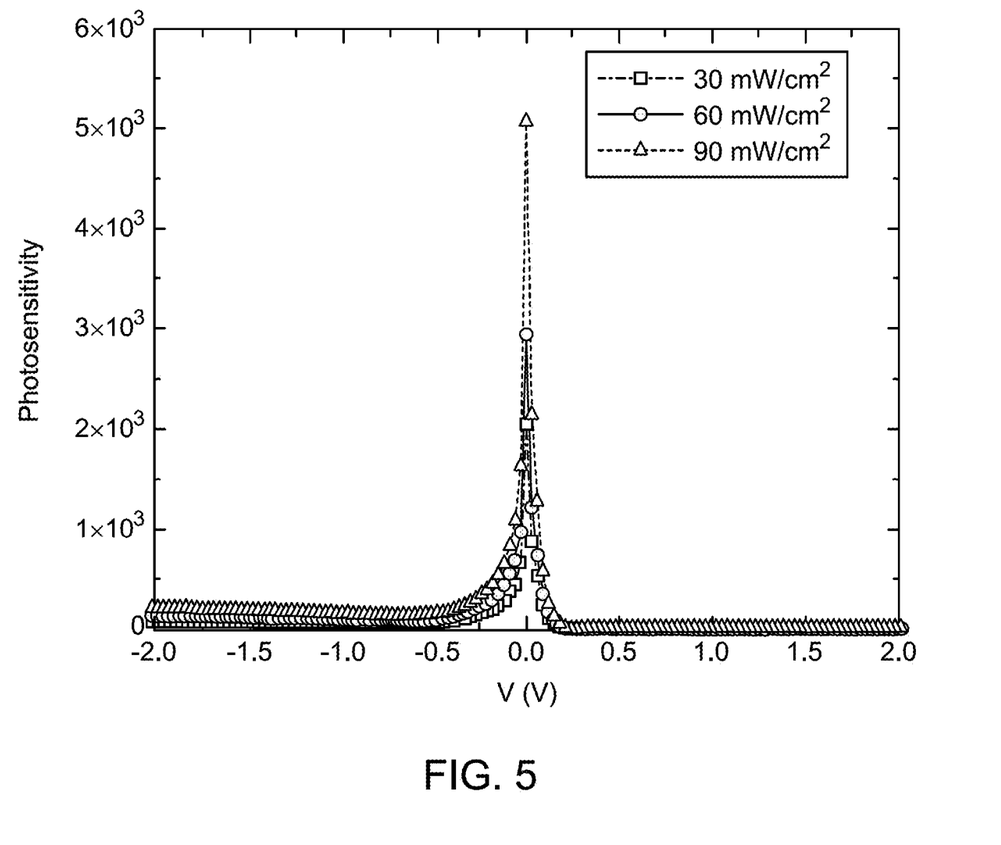
FIG. 5 depicts variation of photosensitivity with voltage for the PEDOT:PSS@Chl layer-based solar cell with a PEDOT:PSS@Chl layer thickness of 50 nanometers (nm), according to certain embodiments.
Figure 6:
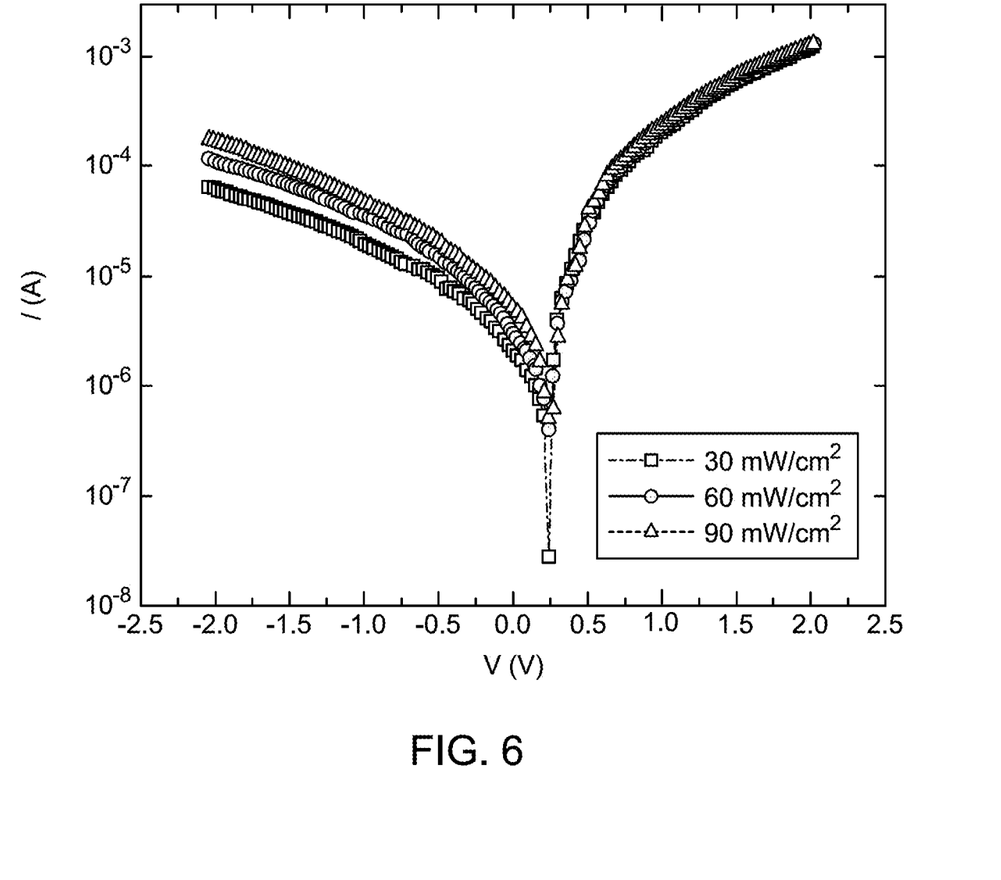
FIG. 6 depicts current-voltage (I-V) characteristics of the PEDOT:PSS@Chl layer-based solar cell with a PEDOT:PSS@Chl layer thickness of 50 nm under different illumination intensities, according to certain embodiments.

PEDOT:PSS doped with 10 wt. % Chl demonstrates improvements in optical and electrical properties, highlighting its potential for application in solar cells. FIG. 4 displays a schematic illustration of the functioning of different components of PEDOT:PSS@Chl-based solar cell. The increase in light transmission by approximately 20% after doping with Chl indicates enhanced light-harvesting capabilities of the composite material. This improvement can increase photon absorption and conversion efficiency within the solar cell. FIG. 5 depicts variation of photosensitivity along an applied voltage for the PEDOT:PSS@Chl material with a thickness of 50 nm. A power conversion efficiency (PCE) of 13.02% achieved with the PEDOT:PSS@Chl material demonstrates the effectiveness of the material in converting light energy into electrical energy. FIG. 6 depicts current-voltage (I-V) characteristics of the PEDOT:PSS@Chl material with a thickness of 50 nm under different illumination intensities. The high short-circuit current density ($J_{SC}$) of 31.37 milliamperes per square centimeter (mA/cm$^2$), the open-circuit voltage ($V_{oc}$) of 0.61 volts (V), and the fill factor of 61% further indicate the high performance of the material in generating electricity from sunlight. The PEDOT:PSS@Chl material provides a dual functionality: the PEDOT:PSS provides enhanced conductivity and structural support, while the Chl contributes to improved light absorption and conversion efficiency. This combination of materials results in a composite that offers good performance compared to traditional PEDOT:PSS-based solar cells.

The benefits of using a PEDOT:PSS@Chl material in solar cells include an increased light transmission and improved optical properties leading to better utilization of sunlight, resulting in higher efficiency. A high PCE achieved with the PEDOT:PSS@Chl material indicates its potential for generating electricity from solar energy. By incorporating PEDOT:PSS and Chl from renewable sources, the composite offers a more sustainable and environmentally friendly alternative for solar cell applications. The use of abundant and inexpensive materials in the composite makes it a cost-effective solution for solar energy conversion.

Overall, the combination of Chl within the PEDOT:PSS matrix by about 10 wt. % results in a high-performance composite material that shows efficiency and sustainability of solar cells. The present disclosure uses Chl extracted from green algae (existing in the Neom coast of KSA) to fabricate a solar cell using inexpensive methods. By incorporating Chl in an amount of 10 wt. % into the PEDOT:PSS material, the solar cell of the present disclosure offers a sustainable solution that leverages the light-harvesting properties of natural pigments to improve the optical performance of solar cells. This cost-effective approach reduces manufacturing expenses and promotes environmental benefits by utilizing renewable resources and reducing reliance on synthetic additives. Overall, the solar cell fabricated by the method of present disclosure focuses on affordable fabrication methods and environmental sustainability in the field of solar energy technology.

Numerous modifications and variations of the present disclosure are possible in light of the above teachings. Therefore, it is to be understood that within the scope of the appended claims, the disclosure may be practiced other than as specifically described herein.

The invention claimed is:

1. A solar cell, including:
   a first layer including a silica material;
   a second layer including an indium tin oxide material;
   a third layer including a chlorophyll-doped poly(3,4-ethylenedioxythiophene):polystyrene sulfonate (PEDOT:PSS@Chl) material,
   wherein the PEDOT:PSS@Chl material includes chlorophyll (Chl) in an amount of 4 to 12 percent by weight (wt. %) based on a total weight of the PEDOT:PSS@Chl material,
   wherein the PEDOT:PSS@Chl material has a surface area of 500 to 550 meter square per gram ($m^2/g$),
   wherein the third layer has a thickness of 30 to 70 nanometer (nm),
   a fourth layer including a silver material; and
   a fifth layer including a silica material.

2. The solar cell of claim 1, wherein the PEDOT:PSS@Chl material is porous and has a cumulative surface pore volume of 0.05 to 0.15 cubic centimeter per gram ($cc^3/g$),
   wherein the third layer consists of the chlorophyll and the poly(3,4-ethylenedioxythiophene):polystyrene sulfonate;
   wherein the chlorophyll is homogeneously dispersed in a matrix of poly(3,4-ethylenedioxythiophene):polystyrene sulfonate;
   wherein the second layer is directly adjacent and continuous with a first side of the third layer;
   wherein the fourth layer is directly adjacent and continuous with a second side of the third layer; and
   wherein the chlorophyll is present only in the third layer.

3. The solar cell of claim 1, wherein the PEDOT:PSS@Chl material is porous and has a pore diameter of 60 to 70 angstrom (Å).

4. The solar cell of claim 1, wherein a thermogravimetric analysis (TGA) weight of the PEDOT:PSS@Chl material is 10 to 20 percent (%) greater than a TGA weight of a same PEDOT:PSS material without the chlorophyll up to a temperature of 600 degrees Celsius (° C.).

5. The solar cell of claim 1, wherein the PEDOT:PSS@Chl material has a 15 to 25% increase in light transmission compared to a same PEDOT:PSS material without the chlorophyll.

6. The solar cell of claim 1, wherein the solar cell has a power conversion efficiency of 10 to 15%.

7. The solar cell of claim 1, wherein the solar cell has a short-circuit current density of 25 to 35 milliamperes per square centimeter ($mA/cm^2$).

8. The solar cell of claim 1, wherein the solar cell has an open-circuit voltage of 0.5 to 0.7 volts (V).

9. The solar cell of claim 1, wherein the solar cell has a fill factor of 55 to 65%.

10. The solar cell of claim 1, wherein the third layer has a thickness of 40 to 60 nm.

11. The solar cell of claim 1, wherein the third layer has a thickness of 45 to 55 nm.

12. The solar cell of claim 1, wherein the third layer is in the shape of agglomerated spherical nanoparticles having a diameter of 30 to 300 nm.

13. The solar cell of claim 1, wherein the PEDOT:PSS@Chl material includes chlorophyll in an amount of 9 to 11 wt. % based on a total weight of the PEDOT:PSS@Chl material.

14. The solar cell of claim 1, wherein the chlorophyll is dispersed in a PEDOT and PSS network.

15. The solar cell of claim 14, wherein the chlorophyll is dispersed in the PEDOT and PSS network through π-π stacking interactions.

16. The solar cell of claim 1, wherein a weight ratio of PEDOT to PSS is from 1:1 to 1:10.

17. The solar cell of claim 1, wherein the PEDOT:PSS@Chl material is spin coated on to the second layer.

18. A method of converting light energy into electrical energy, comprising:
    illuminating the solar cell of claim 1 with light;
    exciting electrons in the third layer; and
    collecting excited electrons to generate electrical energy.

19. The solar cell of claim 1, wherein the fourth layer has a thickness of 20 to 80 nm.

20. The solar cell of claim 1, wherein the second layer has a thickness of 20 to 200 nm.

* * * * *